United States Patent [19]
Kim

[11] Patent Number: 5,794,202
[45] Date of Patent: Aug. 11, 1998

[54] IC CARD MEMORY HAVING A SPECIFIC RECORDING FORMAT AND METHOD FOR RECORDING/REPRODUCING A DIGITAL VOICE THEREFROM

[75] Inventor: Byoung-Jun Kim, Suwon, Rep. of Korea

[73] Assignee: Samsung Electronics Co., Ltd., Kyungki-do, Rep. of Korea

[21] Appl. No.: 672,049

[22] Filed: Jun. 26, 1996

[30] Foreign Application Priority Data

Jun. 28, 1995 [KR] Rep. of Korea ............... 17856/1995

[51] Int. Cl.⁶ ............................................. G10L 3/00
[52] U.S. Cl. ........................... 704/270; 364/DIG. 1; 360/72.2; 360/32
[58] Field of Search ..................... 379/88; 360/32, 360/72.2; 395/2.79

[56] References Cited

U.S. PATENT DOCUMENTS

| | | | |
|---|---|---|---|
| 4,677,657 | 6/1987 | Nagata et al. | 455/558 |
| 4,698,776 | 10/1987 | Shibata | 395/2.1 |
| 4,717,261 | 1/1988 | Kita et al. | 368/63 |
| 5,056,145 | 10/1991 | Yamamoto et al. | 395/2.79 |
| 5,210,761 | 5/1993 | Fukami et al. | 371/40.16 |
| 5,493,105 | 2/1996 | Desai | 235/375 |
| 5,499,316 | 3/1996 | Sudoh et al. | 395/2.79 |
| 5,541,359 | 7/1996 | Lee | 84/645 |

*Primary Examiner*—Tod R. Swann
*Assistant Examiner*—David Laugjahr
*Attorney, Agent, or Firm*—Sughrue, Mion, Zinn, Macpeak & Seas, PLLC

[57] ABSTRACT

An IC card memory includes a header region for storing information about the IC card memory and information about a format, a chapter attribute table (CAT) region for storing information relating to a single chapter, a cluster index table (CIT) region for storing an address of a single cluster index corresponding to a recorded data block, and a data region for storing digital voice data.

11 Claims, 5 Drawing Sheets

IC CARD MEMORY HAVING A SPECIFIC RECORDING FORMAT AND METHOD FOR RECORDING/REPRODUCING A DIGITAL VOICE THEREFROM

BACKGROUND OF THE INVENTION

1. Field of the Invention

The present invention relates to an integrated circuit (IC) card memory used in a digital voice recording/reproducing apparatus, and more particularly to such an IC card memory having a specific recording format and a method for recording/reproducing a digital voice therefrom.

The present application for an IC card memory, is based on Korean Application No. 17856/1995 which is incorporated herein by reference for all purposes.

2. Description of the Related Art

There are no particular recording formats used in recording an analog voice (or music) signal on an existing magnetic tape. Therefore, no complex conversion processes are needed to record such a signal on a magnetic tape. That is, in contrast to DAT, DCC, etc. equipment, for example, in which a digital signal is recorded on a magnetic tape, the method of recording an analog signal is performed by converting the input signal to an electrical waveform then recording that waveform on the tape without employing any particular processing. However, in a digital recording environment, various error correction and data protection methods are used to prevent degradation in voice quality or storage capacity. Recording an analog voice signal on a magnetic tape can lead to degradation in voice quality or storage since such methods are not employed.

A general analog recording/reproducing apparatus, as shown in FIG. 1, includes a microphone MIC for receiving an analog voice signal, a recording amplifier 52 for amplifying the analog voice signal to be recorded, a key input unit 51 for receiving an operating signal, a driving controller 53 for controlling and driving a magnetic tape, a recording/reproducing unit 56 for recording/reproducing a modulated signal from the magnetic tape, a reproducing amplifier 55 for amplifying a reproduced signal, and a speaker SPK for reproducing and generating a signal.

The analog voice signal received through the microphone MIC is modulated according to the recording frequency of a magnetic head. The modulation determines a voltage to be transmitted to the head based on the amplitude of the input signal. The modulated signal is sent to the magnetic head and recorded on a moving magnetic tape. If a large voltage flows into the head, a strong magnetic field is formed according to the characteristic of the magnetic head, and the magnetic field causes a signal to be recorded on the magnetic tape. During reproduction, the signal recorded on the magnetic tape is read and then converted into an electric signal according to its magnitude. The converted signal is transmitted to a mounted speaker or headphone, or to an external line terminal.

However, since the analog voice recording/reproducing apparatus sends the input analog signal to the magnetic head to create the magnetic field, respective input signals are indistinguishable and no information about the input signals is available for other purposes. Therefore, it is impossible to supply such information to other systems such as a computer system, communication system, etc. Further, since recording storage is influenced by surrounding circumstances, the signal can be unstable.

If a digital signal is used instead of an analog signal, there is almost no degradation in voice quality and almost no errors are produced during recording and reproduction. Moreover, it is possible to classify the recorded information, and it is widely applicable.

An IC card memory is presently coming to the fore as the next generation of recording medium. The IC card memory is more portable and has better data storage properties than other recording media, such as an analog tape, a compact disk and a minidisk, etc. However, applicable equipment is insufficiently developed, since a memory device suitable therefor is high priced, and no uniform recording format exists.

SUMMARY OF THE INVENTION

It is therefore an object of the invention to provide an IC card memory having a constant recording format and a method for recording/reproducing a digital voice therefrom.

In accordance with an aspect of the invention, there is provided an IC card memory, including a header region, for storing information about the IC card memory and about a format used in the IC card memory, a chapter attribute table region for storing information related to a chapter, a cluster index table region for storing an address of one cluster index corresponding to a recorded data block, and a data region for storing digital voice data.

In accordance with another aspect of the invention, there is provided a method for recording and reproducing a digital voice using an IC card memory including the steps of: sensing whether the IC card memory is inserted; checking whether a check array is correct by reading the check array of a bad-block managing region; reading the contents and an address and reading a header region if there are recorded contents of the check array; and loading a chapter attribute table and a chapter index table if header identifications are correct.

The invention is more specifically described with reference to the attached drawings.

DETAILED DESCRIPTION OF THE PREFERRED EMBODIMENT

In the following description, specific details such as circuit components etc. are set forth to provide a more thorough understanding of the invention. It will be apparent, however, to one skilled in the art, that the invention may be practiced without these specific details. In other instances, well known functions or structures have not been described so as not to obscure the invention.

Figure 2:
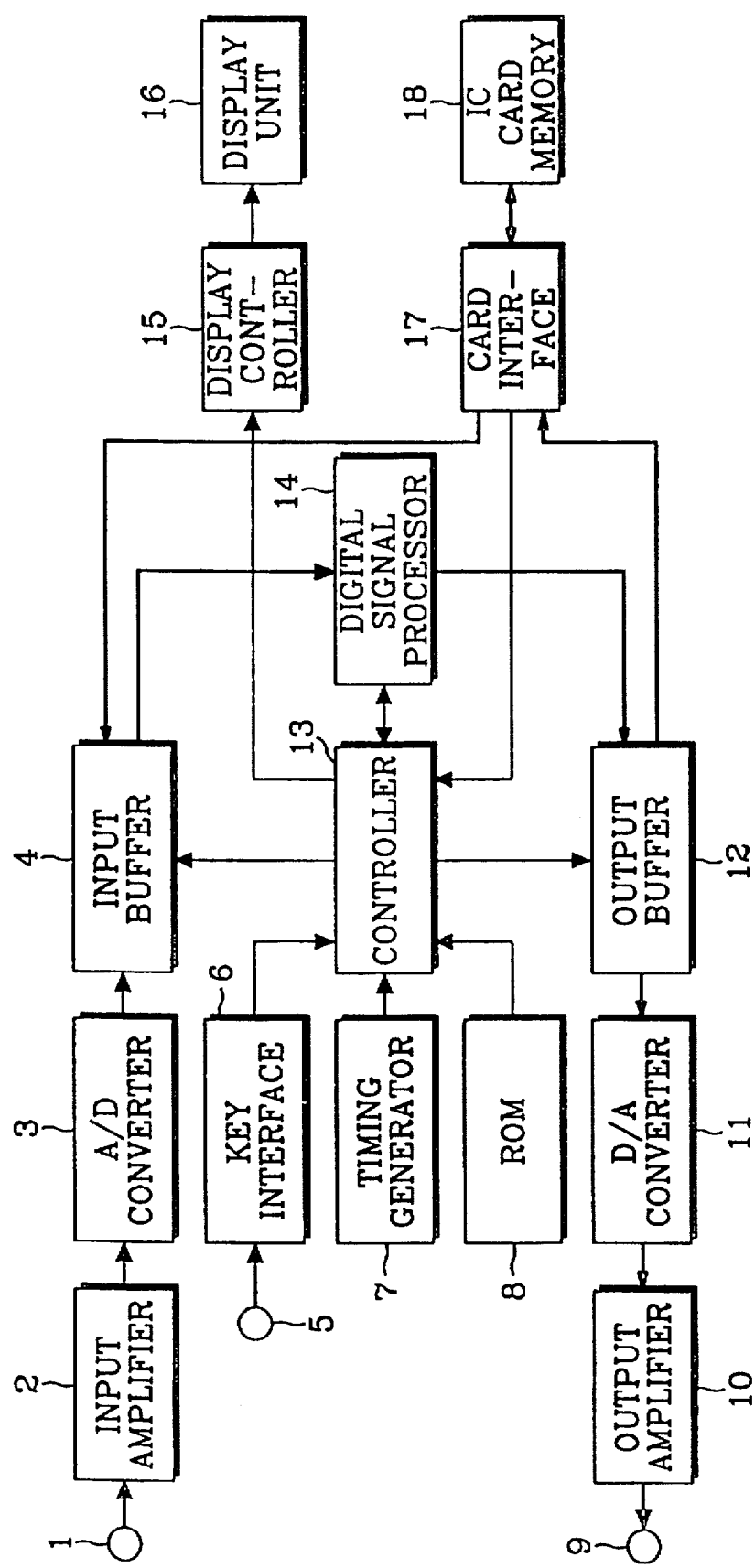
FIG. 2 is a block diagram of a digital voice recording/reproducing apparatus using an IC card memory according to the present invention.

Referring to FIG. 2, a digital voice recording/reproducing apparatus is shown which employs an IC card memory 18 for storing digital voice data. A card interface 17 checks whether the IC card memory 18 is in contact with the digital voice recording/reproducing apparatus. If it is sensed that the IC card memory 18 is inserted in the apparatus, card interface 17 supplies power, a clock signal, data, etc., or reads-out data from IC card memory 18. A controller 13 controls the entire operation of the digital voice recording/ reproducing apparatus. A voice input terminal 1 receives a voice signal via a microphone etc., an input amplifier 2 amplifies the received voice signal, and an analog-to-digital (A/D) converter 3 then digitizes the amplified voice signal. An input buffer 4 temporarily stores the digitized voice signal output from A/D converter 3 or another digital voice signal provided through card interface 17 from the IC card memory 18.

A key input terminal 5 provides various commands and data to the digital voice recording/reproducing apparatus. A key interface 6 causes controller 13 to sense key input data received via key input terminal 5. A timing generator 7 checks and controls timing, and a ROM 8 stores data and programs. A digital signal processor 14 digitally processes a signal output from input buffer 4, and generates the output data in either a compressed or non-compressed form. An output buffer 12 temporarily stores the signal processed by digital signal processor 14. A digital-to-analog (D/A) converter 11 converts the digital signal stored and output from output buffer 12 to an analog signal. An output amplifier 10 amplifies the analog-converted voice signal output from D/A converter 11. A voice output terminal 9 provides the amplified voice signal to an external device, such as a speaker, etc. A display controller 15 displays digital voice recording/ reproducing process information on a display unit 16 under the control of controller 13.

Figure 7:
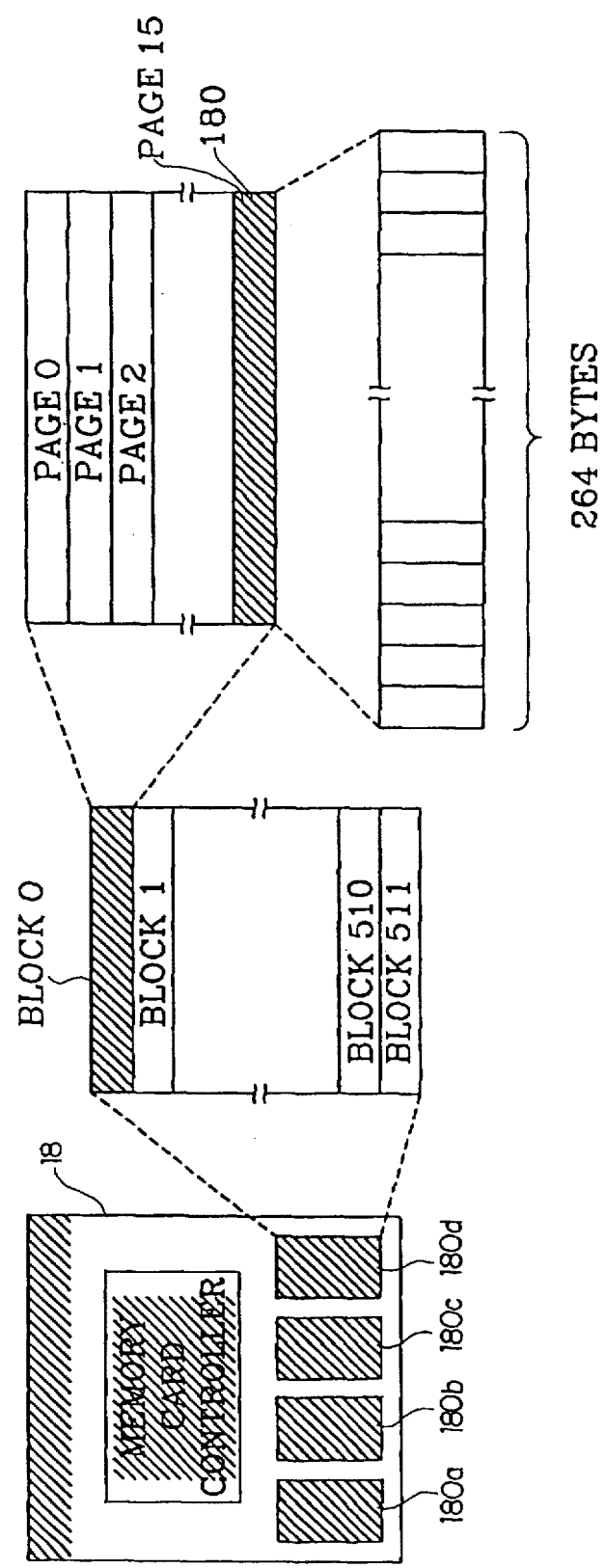
FIG. 7 shows an internal structure of a memory card.

FIG. 7 shows an internal structure of the memory card. One memory card includes one or more memory chips. One memory chip contains a prescribed number of blocks each having a prescribed number of pages. One page includes a prescribed number of columns each having one or more memory cell (byte). For example, a single memory card 18 has 4 memory chips 180a–180f, each having 512 blocks, as shown in FIG. 7. A single block consists of 16 pages each including 256 columns (bytes), plus an additional 8 columns (bytes) for storing page related information. Thus, each page consists of 264 columns (bytes).

Figure 1:
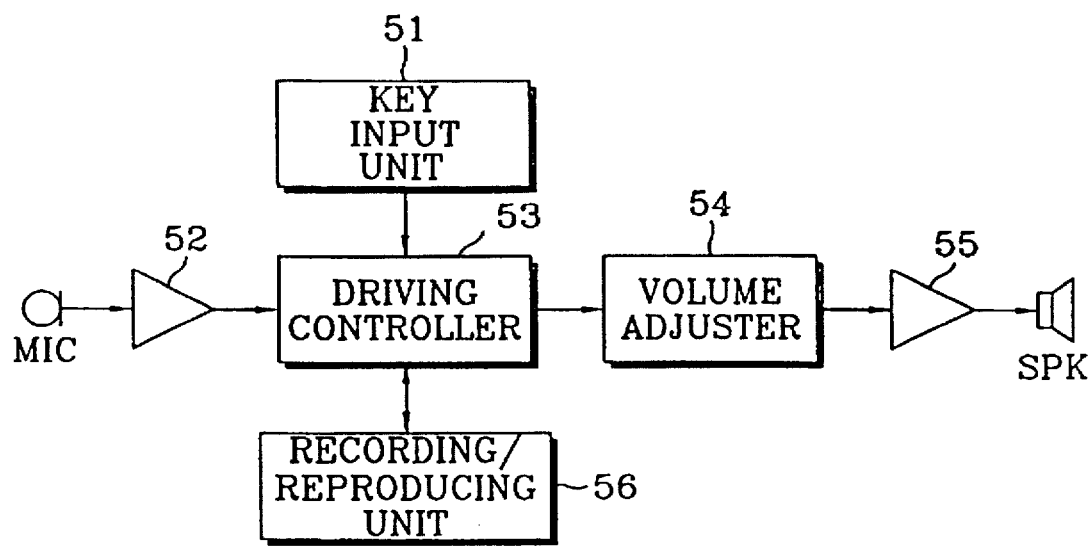
FIG. 1 is a block diagram of a general analog voice recording/reproducing apparatus.
Figure 3:
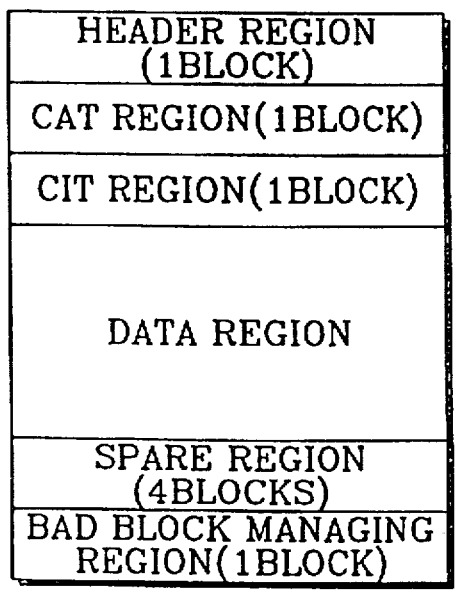
FIG. 3 shows a format of a recordable memory card.
Figure 4:
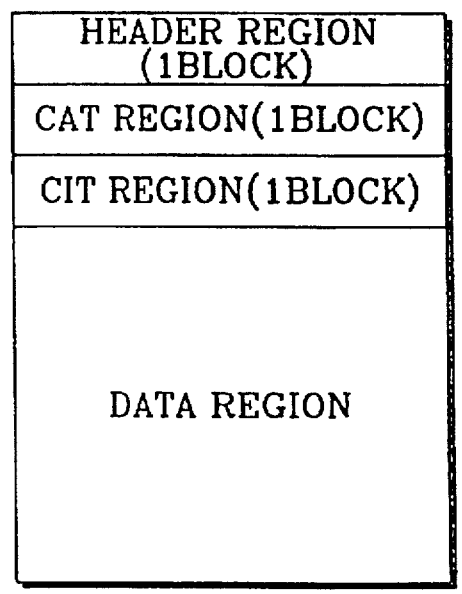
FIG. 4 shows a format of a reproduction-only memory card.

A recording format according to the present invention is classified into two types of formats: a format for use in a recording/reproducing system and another format for use in a reproduction-only system. Each format consists of a system region and a data region. FIG. 3 shows the format for a recordable memory card. The system region is divided into a header region, a chapter attribute table (CAT) region, a cluster index table (CIT) region, a spare region and a bad-block managing region. FIG. 4 shows the format for a reproduction-only memory card. The system region for the reproduction-only memory card also is divided into header, CAT and CIT regions. Thus, the system region performs the same function irrespective of whether employed in a recording/reproducing system or a reproduction-only system. Therefore, a description is given based only on the format for the recording/reproducing system.

Information about the entire IC card memory and format is listed in the header region. Table 1, set forth below, shows the contents of the header region in a recording/reproducing system. Only 256 bytes are used, and the remaining portion of the memory is empty and is designated as a reserved region.

TABLE 1

HEADER REGION - RECORDING/REPRODUCTION

| Offset Size (Bytes) | Title | Contents |
|---|---|---|
| 08h (8) | Format check code | Check whether an inserted IC card memory is in a Flash Card Audio Format (FCAF). "FFh, 53h, 41h, 4Dh, 53h, 55h, 4Eh, 47h" (i.e., Samsung) |
| 08h (8) | Format name | Basic IC card memory format name. ASCII code of "FCAF_1.0". |
| 10h (18) | System ID | Record manufacturer and company name up to 16 characters in ASCII code. |
| 20h (6) | Format date and time | Record date and time of initial formatting of IC card memory: "xxh (year), xxh (month), xxh (day)" "xxh (hour), xxh (minute), xxh (second)" Record only a value added to 1994 as a year and record time in the twenty-four-hour system. |
| 26h (1) | Card type indicator | IC card memory type. Indicate whether IC card memory is recordable (2 most significant bits): 00-read-only, 11-recordable. Used memory (6 least significant bits): x0-ROM, x1-SRAM, x2-EPROM, x3-EEPROM, x4-NAND Flash, X5 NOR Flash, others-reserved. |
| 27h (1) | Number of blocks per cluster | Number of blocks in one cluster (at present 4096 bytes), denoted in binary. |
| 28h (4) | Reserved region | Fill with "FFH". |
| 2Ch (4) | Start block number of CAT | Block number in which CAT begins (= block address). |
| 30h (2) | Number of CAT entry | The total number of CATs generated during formatting. For example, one of: 128, 256, 512 and 1024. |
| 32h (4) | Start block number of CITs | Block number at which CIT begins (= block address). |
| 36h (3) | Number of CIT entry | The total number of CITs generated during formatting. One CIT corresponds to one cluster. |
| 39h (1) | Number of copied CITs | The number of copied CITs to be used when one CIT is damaged. |
| 3Ah (4) | Reserved region | Fill with "FFH". |
| 3Eh (1) | Number of recorded chapters | Total number of recorded chapters. Current maximum number is 128. |
| 3Fh (1) | Number of start blocks in data region | Magnitude of data region (in bytes). The most significant byte is 3 and the least significant byte is 0. Total number of blocks − (spare region + bad-block managing region + header region + CAT region + CIT region) |
| 43h (4) | Total number of blocks in data region | Total number of blocks of data region. The actual magnitude of data region is obtained by subtracting the total number of bad-blocks within data region from the above data region magnitude. |
| 47h (2) | Number of bad-blocks | Total number of bad-blocks (Cumulative). |
| 49h (183) | Reserved region | Fill with "FFH". |

Table 2, set forth below, shows the contents of the header region in a reproduction-only system.

TABLE 2

HEADER REGION - REPRODUCTION-ONLY

| Offset Size (Bytes) | Title | Contents |
|---|---|---|
| 08h (8) | Format check code | Check whether an inserted IC card memory is FCAF format. "FFh, 53h, 41h, 4Dh, 53h, 55h, 4Eh, 47h" |
| 08h (8) | Format name | Basic IC card memory format name. ASCII code of "FCAF_1.0". |
| 10h (18) | System ID | Record manufacturer and company name up to 16 characters by ASCII code. |
| 20h (6) | Format date and time | Record date and time of initial formatting of IC card memory. "xxh (year), xxh (month), xxh (day)" "xxh (hour), xxh (minute), xxh (second)" Record only a value added to 1994 as the year, and record time in the twenty-four-hour system. |
| 26h (1) | Card type indicator | IC card memory type. Indicate if IC card memory is recordable (2 most significant bits): 00-read-only, 11-recordable. Used memory (6 least significant bits): x0-ROM, x1-SRAM, x2-EPROM, x3-EEPROM, x4-NAND Flash, X5-NOR Flash, others-reserved. |
| 27h (1) | Number of blocks per cluster | Number of blocks in one cluster (presently 4096 bytes), denoted in binary. |
| 28h (4) | Reserved region | Fill with "FFH". |
| 2Ch (4) | Start block number of CAT | Block number at which CAT begins (= block address). |
| 30h (2) | Number of CAT entry | Total number of CATs generated during formatting, e.g., one of: 128, 256, 512 and 1024. |
| 32h (4) | Start block number of CITs | Block number at which CIT begins (= block address). |
| 36h (3) | Number of CIT entry | Total number of CITs generated during formatting. One CIT corresponds to one cluster. |
| 39h (1) | Number of copied CITs | Number of copied CITs to be used when one CIT is damaged. |
| 3Ah (4) | Reserved region | Fill with "FFH". |
| 3Eh (1) | Number of recorded chapters | Total number of recorded chapters. The current maximum number is 128. |
| 3Fh (1) | Number of start blocks in data region | Magnitude of data region (in bytes). The most significant byte is 3 and the least significant byte is 0. |
| 43h (4) | Total number of bad-blocks in data region | Total number of bad-blocks within data region. |
| 47h (185) | Reserved region | Fill with "FFH". |

Table 3, set forth below, shows the contents of the CAT region. The CAT region is a region for collecting information related to a chapter. A chapter corresponds to the data that is recorded up until execution of an operation is stopped. One chapter attribute table consists of 32 bytes, and 128 chapters are recordable. That is, since 32 bytes/chapter×128 chapters=4,096 (=4K) bytes, one block is completely filled. In one page, which consists of 264 bytes, only 256 bytes are used and the other 8 bytes are used to record additional information related to the page.

TABLE 3

CAT REGION

| Offset Size (Bytes) | Title | Contents |
|---|---|---|
| 00h (12) | Chapter name | Corresponding chapter name. This value is more effective in MASK ROM. |
| 0Ch (3) | Recording date | Recording start date: "xxh (year), xxh (month), xxh (day)" |
| 0Fh (3) | Recording time | Recording start time: "xxh (hour), xxh (minute), xxh (second)" |
| 12h (4) | Chapter size | Chapter size (in bytes). |
| 16h (6) | Chapter mode | Recorded data mode, e.g., voice + video + text + etc., indicates the characteristic of respective data. Record voice, video, text by 2 bytes, respectively, from the most significant byte. |
| 1Ch (2) | Reserved region | Fill with "FFH". |
| 1Eh (2) | CIT start number | CIT number at which corresponding chapter starts (block and page addresses). |

Table 4, set forth below, shows a CIT region which stores information relating to a cluster. A cluster is a basic unit for erasing and management, in which one cluster indicates one or more blocks. Each cluster index table is 2 bytes and indicates an address of actual data. In other words, an address of the cluster index corresponding to the recorded block is recorded. Specific data codes other than actual CIT addresses are preferably defined as follows:

FFFFh: unused cluster

FFF5h: bad cluster

FFFAh last cluster, and other values : addresses of other clusters

Where "FFFAh" is recorded in the last recorded cluster. That is, successively connected cluster indices are read until "FFFAh" appears. A cluster start address is recorded in the last 2 bytes of a corresponding CAT, as shown above in Table 3.

TABLE 4

| CIT REGION | | | |
|---|---|---|---|
| xxxxh | xxxxh | ... | xxxxh |
| xxxxh | xxxxh | ... | xxxxh |
| . | . | . | . |
| . | . | . | . |
| . | . | . | . |
| xxxxh | xxxxh | ... | xxxxh |

The data region, shown in FIGS. 3 and 4, is for recording data. In one page, only 256 bytes of pure data are recorded and in the other 8 bytes various control signals and additional information corresponding to each page are recorded. Page information for the other 8 bytes is preferably defined as follows:

bytes 4–7: reserved regions byte 3: indicates end of data (EOD)

byte 2: end address of data bytes 0–1: reserved regions.

If the above page information is recorded together with the data, magnitude and end of the data can be accurately known during reproduction. The end of data (EOD) has essentially the same meaning as an end of file (EOF) code used in computer systems.

The spare region, shown in FIG. 3, has a basic size of 4 blocks. This region is previously prepared for the case in which any one of the header, CAT, CIT and bad-block managing regions is determined to have a bad-block. The number of spare regions is indicated in the bad-block managing region. The start address of the spare region is predetermined, and 4 blocks therefrom are used for the spare region. Even if there is no bad-block in the system, data can be recorded in the data region only up to the start address of the spare region. Therefore, the spare region should necessarily be emptied. If the data region is replaced (copied) with one of the system regions, this is recorded in the bad-block managing region. When information regarding a corresponding address and a replaced region is recorded and the card is again inserted, the system regions can be read. If there is a bad-block located within the data region, that bad-block is not used.

Table 5, which is set forth below, shows the contents of the bad-block managing region. The bad-block managing region is read together with the header region in the system. To correctly read the data region, and the system region including the header region, the bad-block managing region should be read. A bad-block generated in the data region is managed according to the bad-block managing region so that bad-block is not reused.

TABLE 5

BAD-BLOCK MANAGING REGION

| Offset Size (Bytes) | Title | Contents |
|---|---|---|
| 00h (16) | Check array | "FFh, FFh, AAh, 55h, 0Fh, F0h, 24h, DBh, 03h, 0Ch, 30h, C0h, 33h, 66h, CCh, 99h" |
| 10h (2) | Version | PCAF version number |
| 12h (2) | Spare region number | Total number of spare regions (blocks) within the IC card memory |
| 14h (8) | Spare region address | Block address of each spare region |
| 1Ch (4) | Contents of spare region | Contents of each spare region (a replaced system name) |
| 20h (2) | Number of blocks | Total number of blocks within the IC card memory |
| 22h (2) | Number of bad-blocks | Total number of bad-blocks within the data region of the IC card memory |
| 24h (2012) | Bad-block address | Address of each bad-block |

In the above Table 5, the check array indicates whether or not the data stored in the bad-block managing region is correct. If the check array is not correctly perceived, the bad-block managing region is placed in the spare region. The check array operates as a known sequence for searching for a bad-block managing region in the spare regions. For example, the check array sequence in Table 5 is a sequence of ASCII codes which indicates a specific check format. These values serve to distinguish errors in and the format of the transmission.

Figure 5:
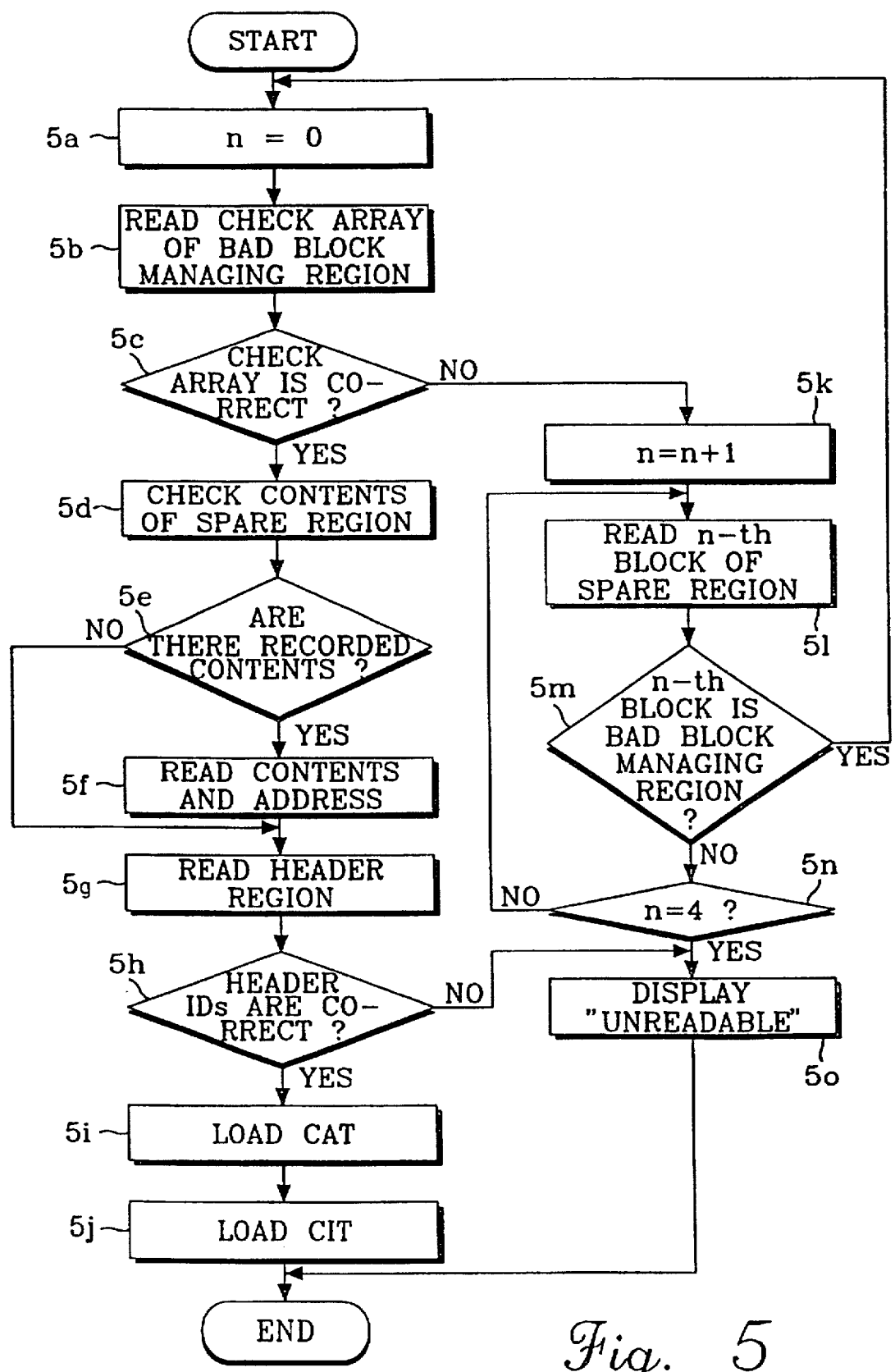
FIG. 5 is a flow chart showing a recording/reproducing memory card loading sequence according to the present invention.

FIG. 5 is a flowchart showing a loading sequence for a recording/reproducing memory card. If the memory card is sensed as being inserted in the apparatus, then the check array is checked to determine if it is correct by reading the check array of the bad-block managing region (steps 5a–5c). If the check array is correct, then the contents of the spare region are checked to determined if there is information recorded in the spare region (step 5d). If so, the contents of the spare region and an address are read and the header region is read (steps 5e–5g). If the spare region contains no recorded contents, then only the header region is read (step 5g). If header identifications (IDs) are correct, the CAT and the CIT regions are loaded (steps 5h–5j).

Meanwhile, if the check array of the bad-block managing region is incorrect, blocks of the spare region are repeatedly read until it is determined that the read block corresponds to a bad-block managing region (steps 5k–5n). Also, if the header IDs are incorrect, a message, such as "unreadable," is displayed on display unit 16 (step 5o). Likewise, if all the blocks of the spare region (e.g., 4 blocks) are read without finding a bad-block region, a message such as "unreadable" is displayed on display unit 16.

Figure 6:
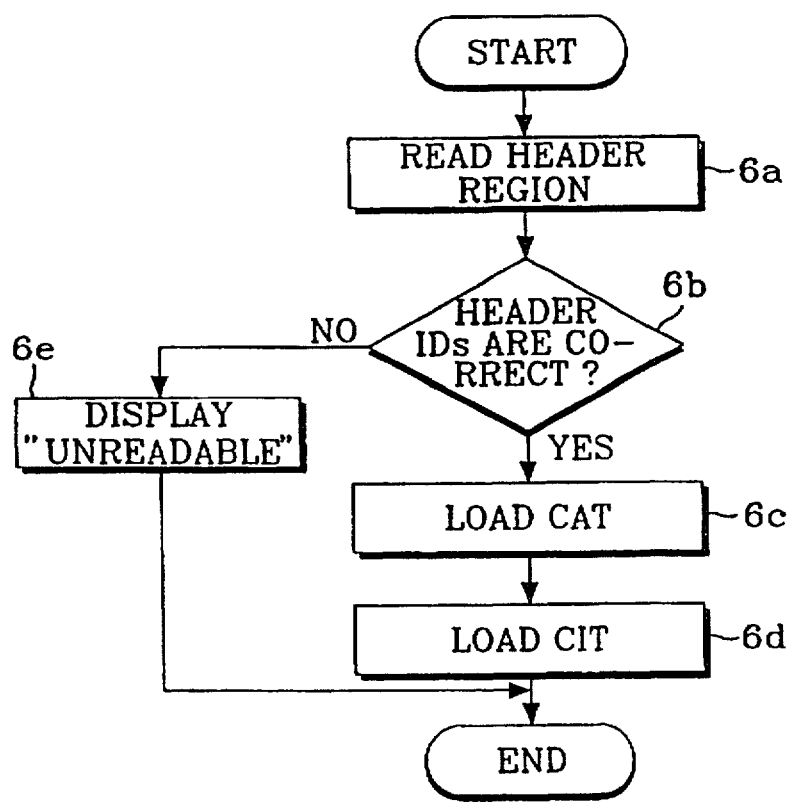
FIG. 6 is a flow chart showing a reproduction-only memory card loading sequence according to the present invention.

FIG. 6 shows a reproduction-only memory card loading sequence. If it is sensed that the memory card is sensed to be inserted in the apparatus, the header IDs are checked by reading the header region to determine if the IDs are correct (steps 6a and 6b). If the header IDs are correct, the CAT and CIT regions are loaded (steps 6c and 6d). If the header IDs are incorrect, a message, such as "unreadable," is displayed on display unit 16 (step 6e).

The recording/reproducing memory card 18, shown for example in FIG. 7, includes one or more recordable/ reproducible semiconductor memory chips, such as an EEPROM (Electrically Erasable and Programmable Read Only Memory) or a flash memory. The recording-only memory card consists of one or more reproducible semiconductor memory chips such as a mask ROM.

Figure 8:
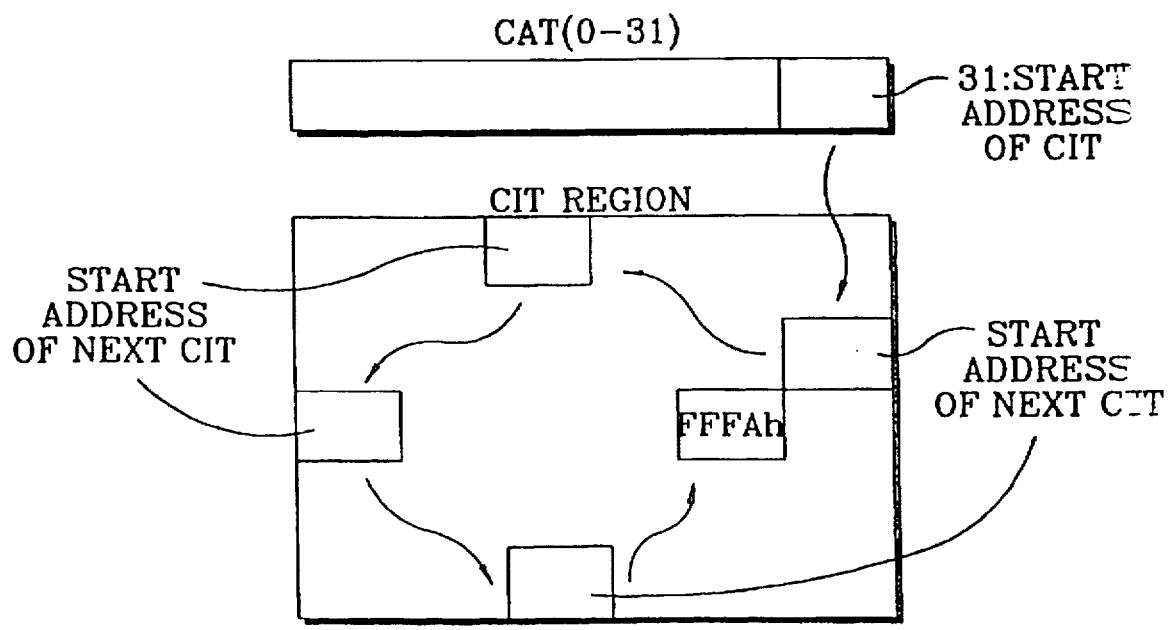
FIG. 8 shows a connection relation between a chapter attribute table (CAT) and a cluster index table (CIT).

FIG. 8 shows a structural relation between the CIT and CAT regions. Since the CIT is important for determining the location of data recorded in the data region, the CIT region is replicated into a number of CIT region copies to protect against damage. If the data region changes, the CIT region should be corrected, accordingly. When repeating recording and erasing operations, although many data pieces occur, the free recording and erasing can be ensured.

As described above, the united recording format provided by the present invention makes it convenient to develop products and produce commercially available commodities based on such a united format. Such an IC memory card has better properties relating to portability, data storage, etc. than other recording media such as an analog tape, a compact disk, a minidisk, etc.

While there has been shown and described what is considered to be a preferred embodiment of the invention, it will be apparent to persons of ordinary skill in the art that various changes and modifications are possible. Therefore, the invention should be understood as including all possible embodiments which do not depart from the principles of the invention as set forth in the appended claims.

What is claimed is:

1. An IC card memory which receives and stores input information, comprising:

a header region for storing IC card memory information regarding the IC card memory and format information regarding a format in which the input information is stored;

a chapter attribute table (CAT) region for storing chapter information related to a chapter, wherein a chapter corresponds to the input information stored in the IC card memory during execution of an operation, the chapter information including information for identifying a starting cluster index table corresponding to the input information;

a cluster index table (CIT) region for storing one or more cluster index tables including the starting cluster index table, wherein the starting cluster index table includes an address corresponding to a data block recorded in the IC card memory; and a data region for storing the input information in said data block.

2. The IC card memory as claimed in claim 1, further comprising a spare region for storing data relating to an occurrence of a bad-block in one of said header, CAT, CIT, and data regions; wherein said bad-block is a portion of said regions having an error.

3. The IC card memory as claimed in claim 1, further comprising a bad-block managing region for storing information for managing a bad-block generated in said data region, wherein said bad-block is a data block having an error.

4. The IC card memory as claimed in claim 2, further comprising a bad-block managing region for storing information for managing said bad-block generated in said data region.

5. The IC card memory as claimed in claim 1, wherein a start address of said CIT region is stored in the least significant bits of said CAT region.

6. The IC card memory as claimed in claim 2, wherein a start address of said CIT region is stored in the least significant bits of said CAT region.

7. The IC card memory as claimed in claim 5, wherein said start address of said CIT region designates a cluster index address of said CIT region, and wherein said designated cluster index address designates another cluster index address.

8. The IC card memory as claimed in claim 7, wherein said input information is digital voice data.

9. A method for recording and reproducing an input signal using an IC card memory and a recording/reproducing apparatus, comprising the steps of:

sensing whether the IC card memory is inserted in the recording/reproducing apparatus;

reading a check array stored in a bad-block managing region of the IC card memory and determining if said check array is correct;

determining if a spare region of the IC card memory has recorded contents and if so reading said contents and an address from said check array and reading a header region of said IC card memory; and loading a chapter attribute table and a chapter index table if said header information is correct.

10. The method for recording and reproducing an input signal as claimed in claim 9, further comprising the step of:

repeatedly reading blocks of a spare region of the IC card memory until one of the read blocks is determined to correspond to said bad-block managing region if said check array of said bad-block managing region is determined to be incorrect.

11. The method for recording and reproducing an input signal as claimed in claim 10, wherein said input signal is a digital voice signal.

* * * * *